US012786578B2

(12) United States Patent
Higuchi et al.

(10) Patent No.: US 12,786,578 B2
(45) Date of Patent: Nov. 3, 2026

(54) IMAGE SENSOR HAVING DIAGONAL AND COUNTER DIAGONAL BINNED PHOTODIODES

(71) Applicant: OmniVision Technologies, Inc., Santa Clara, CA (US)

(72) Inventors: Masayu Higuchi, Tokyo (JP); Liangyu Xu, San Jose, CA (US); Chengming Liu, Fremont, CA (US); Yusuke Oguro, Tokyo (JP); Yitian Tong, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 433 days.

(21) Appl. No.: 18/619,313

(22) Filed: Mar. 28, 2024

(65) Prior Publication Data

US 2025/0310655 A1 Oct. 2, 2025

(51) Int. Cl.

| | |
|---|---|
| ***H04N 25/46*** | (2023.01) |
| ***H04N 25/77*** | (2023.01) |
| ***H10F 39/00*** | (2025.01) |
| ***H10F 39/18*** | (2025.01) |

(52) U.S. Cl.
CPC ............ *H04N 25/46* (2023.01); *H04N 25/77* (2023.01); *H10F 39/18* (2025.01); *H10F 39/8037* (2025.01); *H10F 39/8063* (2025.01)

(58) Field of Classification Search
CPC ........ H04N 25/46; H04N 25/77; H10F 39/18; H10F 39/8037
See application file for complete search history.

(56) References Cited

U.S. PATENT DOCUMENTS

| | | | | |
|---|---|---|---|---|
| 10,116,889 | B2 | 10/2018 | Chen et al. | |
| 11,706,537 | B2 | 7/2023 | Ui et al. | |
| 2025/0310655 | A1* | 10/2025 | Higuchi ................ | H04N 25/46 |

OTHER PUBLICATIONS

Eun Sub Shim, Kyungho Lee, Junghyung Pyo, Wooseok Choi, Jungbin Yun, Taesub Jung, Kyungduck Lee, Seyoung Kim, Chanhee Lee, Seungki Baek, Hyuncheol Kim, Sungsoo Choi, Junseok Yang, Kyoungmok Son, Jongwon Choi, Howoo Park, Bumsuk Kim, Jungchak Ahn, and Duckhyun Chang, All-Directional Dual Pixel Auto Focus Technology in CMOS Image Sensors, 2021 Symposium on VLSI Circuits, Kyoto, Japan, 2021, pp. 1-2, doi:10.23919/VLSICircuits52068.2021.9492472, IEEE, New York, USA.

* cited by examiner

*Primary Examiner* — Mark V Prenty

(57) ABSTRACT

An image sensor comprises a 4-cell DPD pixel array having a first group of pixels, a second group of pixels, a third group of pixels, and a fourth group of pixels. The first group of pixels comprises a first pixel, a second pixel, a third pixel, and a fourth pixel. The first pixel comprises a first photodiode, a second photodiode, a third photodiode, and a fourth photodiode. The four photodiodes are covered by a microlens. The first photodiode is diagonally binned with the fourth photodiode, and the second photodiode is counter-diagonally-binned with the third photodiode.

20 Claims, 9 Drawing Sheets

IMAGE SENSOR HAVING DIAGONAL AND COUNTER DIAGONAL BINNED PHOTODIODES

FIELD OF THE INVENTION

This disclosure relates to image sensors having binned photodiodes, and particularly image sensors having diagonal and counter diagonal binned photodiodes.

BACKGROUND OF THE INVENTION

A color electronic image is usually represented by three primary color signals, which are red (R), green (G), and blue (B) signals. A pixel of an image sensor can detect only one color, and cannot detect all R, G, and B signals at the same pixel location. A pixel array comprises a plurality of R pixels, a plurality of G pixels, and a plurality of B pixels. R, G, and B pixels are usually arranged in Bayer pattern. Bayer pattern includes 2×2 pixels. One version includes R pixel at left side and G pixel at right side of a first row, and G pixel at left side and B pixel at right side of a second row. Complete R signal, G signal, and B signal (R image, G image, and B image) can be interpolated from the Bayer pattern. For example, a complete R signal includes R signal or value at R pixel, G pixels, and B pixel of the Bayer pattern.

In 4-cell pattern, also known as 4-cell Bayer pattern, a group of four pixels replaces a pixel of the Bayer pattern. 4-cell pattern comprises a group of four R pixels, two group of G pixels, and a group of B pixels. In an embodiment, four pixels may be binned together to enhance the signal-to noise ratio (SNR) in low light environment.

An image sensor for phase-detection auto-focus (PDAF) comprises a pixel array, a pixel may include two vertical photodiodes (PDs), i.e., left PD and right PD, under a microlens. The detected phase difference of two PDs is used to determine the distance of an object to the camera, thus auto-focus can be performed. Alternatively, the pixel may include two horizontal PDs, i.e., upper PD and lower PD, under a microlens. It may require either a pair of vertical PDs or a pair of horizontal PDs to perform auto-focus.

In case an image sensor comprises only vertical PDs or horizontal PDs, the final color image produced from the image sensor will have imbalance between horizontal and vertical resolutions. In case the image sensor has both vertical PDs and horizontal PDs, the final color image produced from the image sensor may have balanced resolution in horizontal and vertical directions. However, the final color image will have imbalanced resolution including diagonal or principal diagonal (i.e., running from the upper left corner to the lower right corner of a scene), and counter diagonal or secondary diagonal (i.e., running from the lower left to the upper right of a scene) directions.

Accordingly, an image sensor that will produce a final color image having balanced resolution in all horizontal, vertical, diagonal, and counter diagonal directions is demanded.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
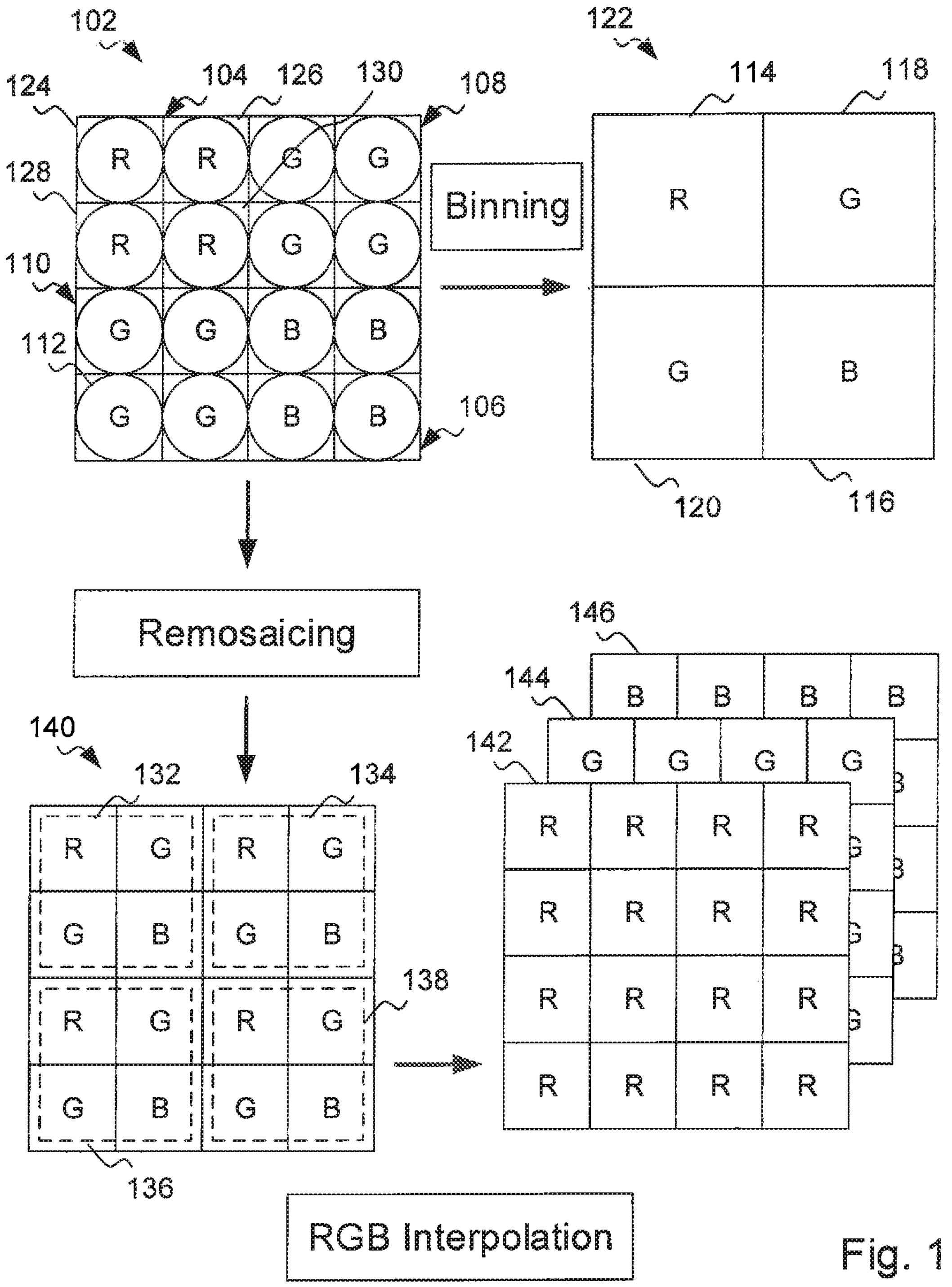
FIG. 1 shows a 4×4 4-cell pattern comprising a group of four R pixels, a group of four B pixels, and two groups of four G pixels.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

FIG. 1 shows a 4×4 4-cell pattern 102 comprising a group of four R pixels 104, a group of four B pixels 106, and two groups of four G pixels 108 and 110. The four groups are located at the four corners of 4×4 4-cell pattern 102. Each pixel is covered by a microlens 112. R pixel is covered by an R color filter, G pixel is covered by a G color filter, B pixel is covered by a B color filter. The color filter may be disposed between microlens and pixel. 4×4 4-cell pattern 102 may be a minimum repeating unit.

The four R pixels of group of pixels 104 may be binned to be a single R pixel 114. The four B pixels of group of pixels 106 may be binned to be a single B pixel 116. The four G pixels of group of pixels 108 may be binned to be a single G pixel 118. The four G pixels of group of pixels 110 may be binned to be a single G pixel 120. R pixel 114, B pixel 116, G pixels 118 and 120 form a 2×2 Bayer pattern 122. For an image represented by 2×2 Bayer pattern 122, the Bayer pattern image can be transformed to an R image, e.g., a complete R signal, a G image, e.g., a complete G signal, and a B image, e.g., a complete B signal, using available interpolation algorithms. Notice that the resulting color image has an Resolution, which is ¼ of the resolution of an input image represented by 4×4 4-cell pattern 102.

Binning is necessary for taking picture in low light environment. Without binning, the SNR of a pixel would not be sufficient to form a good and recognizable image. However, the resolution of the binned image is reduced due to binning.

In normal light environment, binning is not necessary. However, the positions of color or RGB pixels are not in the order of Bayer pattern, which is normally used to represent a color image. 4-cell pixel pattern may be changed to Bayer pattern. The process of changing 4-cell pattern to Bayer pattern is known as remosaicing. At the position of R pixel 124, the R value is unchanged. At the position of R pixel 126, a G value replaces the original R value. The G value is obtained from an interpolation algorithm from surrounding G values alone or in addition of surrounding R and/or B values. At the position of R pixel 128, a G value replaces the original R value. The G value is obtained from an interpolation algorithm from surrounding G values alone or in addition of surrounding R and/or B values. At the position of R pixel 130, a B value replaces the original R value. The B value is obtained from an interpolation algorithm from surrounding B values alone or in addition of surrounding R and/or G values. In this way, a 2×2 Bayer pattern 132 is formed at the original positions of R pixels 124, 126, 128, 130, or group of R pixels 104.

In a similar way, 2×2 Bayer patterns 134 and 136 are formed at the original positions of group of G pixels 108 and 110, and a 2×2 Bayer pattern 138 is formed at the original positions of group of B pixels 106. Bayer patterns 132, 134, 136, and 138 form a part of Bayer pattern image 140. Bayer pattern image 140 comprising four Bayer patterns 132, 134, 136, and 138 may be transformed to an R image 142, a G image 144, and a B image 146, using available interpolation algorithms. Notice that the resulting color image has an Resolution, which is the same as the resolution of an input image represented by the 4×4 4-cell pattern 102.

Figure 2:
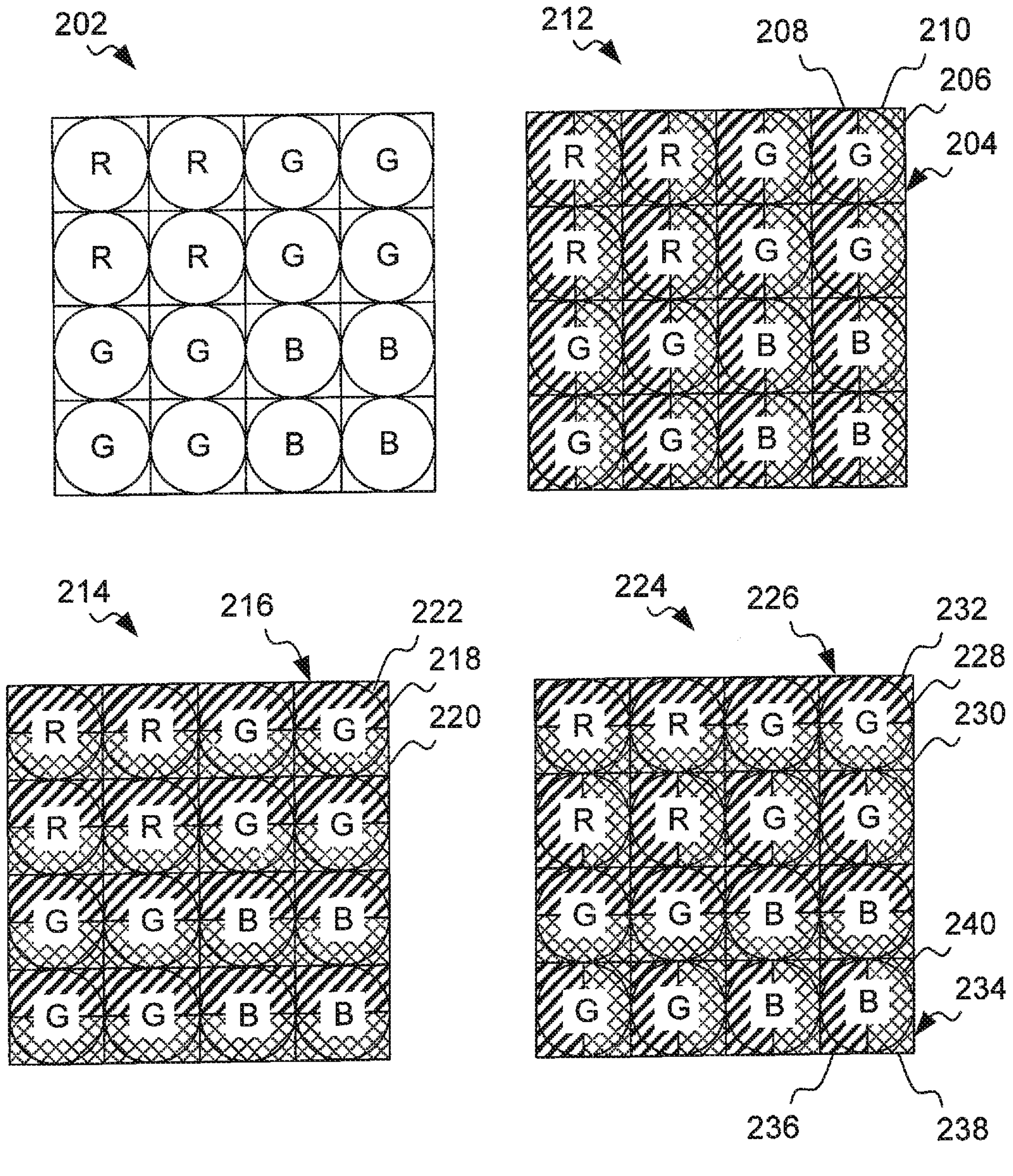
FIG. 2 shows 4×4 4-cell dual photodiode (DPD) pattern comprising pixels having two separate PDs under a microlens.

FIG. 2 shows a 4×4 4-cell pattern 202, which is also known as 4-cell Bayer pattern, comprising a group of four R pixels, a group of four B pixels, and two groups of four G pixels. 4×4 4-cell pattern 202 may be 4×4 4-cell pattern 102 of FIG. 1.

In order to perform the phase detection for phase-detection auto-focus (PDAF), a pixel, e.g., pixel 204, under a microlens, e.g., micolens 206, is divided into two separate parts having each photodiode (PD), e.g., PD 208 and PD 210. This structure is known as dual photodiode (DPD). FIG. 2 further shows a 4×4 4-cell DPD pattern 212 comprising pixel 204 having two separate PDs 208 and 210 under a microlens 206. Pixel 204 includes two vertical PDs 208 and 210, horizontally separated. Accordingly, 4-cell DPD pattern 212 is vertical 4-cell DPD.

FIG. 2 also shows a 4×4 horizontal 4-cell DPD pattern 214 comprising pixel 216 having two separate PDs 218 and 220 under a microlens 222. PD 218 and PD 220 are horizontal PDs separated vertically. FIG. 2 also shows a 4×4 mixed 4-cell DPD pattern 224, comprising pixel 226 having two horizontal PDs 228 and 230 separated vertically under a microlens 232, and pixel 234 having two vertical PDs 236 and 238 separated horizontal under a microlens 240.

Figure 3:
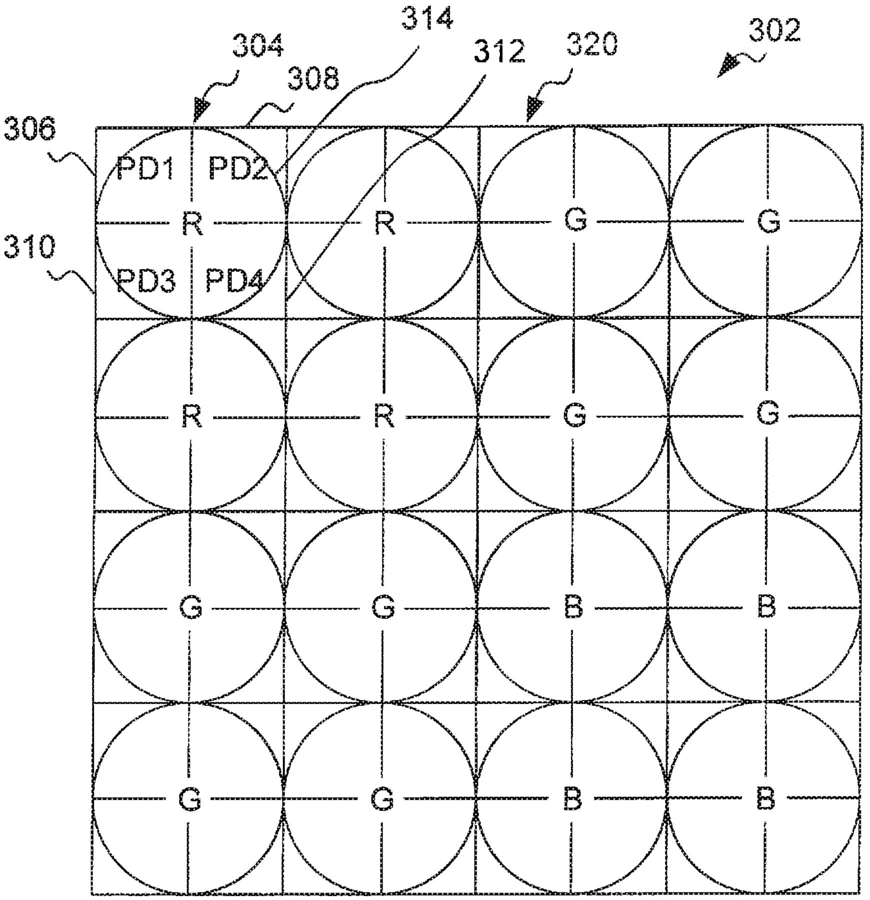
FIG. 3 shows an image sensor comprising 4×4 4-cell DPD pixel array, according to an embodiment of the present invention.

FIG. 3 shows an image sensor 302 comprising a 4×4 4-cell DPD pixel array 320, according to an embodiment of the present invention. 4×4 4-cell DPD pixel array 320 can implement a 4×4 4-cell DPD pattern, such as 4×4 4-cell DPD pattern 212, 214, or 224 of FIG. 2. Image sensor 302 comprises a pixel 304 including a PD1 306, a PD2 308, a PD3 310, and a PD4 312, under a microlens 314. Pixel 304 may be an R pixel, G pixel, or B pixel. Pixel 304 may be included in 4×4 4-cell pixel array 320.

Figures 4A, 4B, 4C:
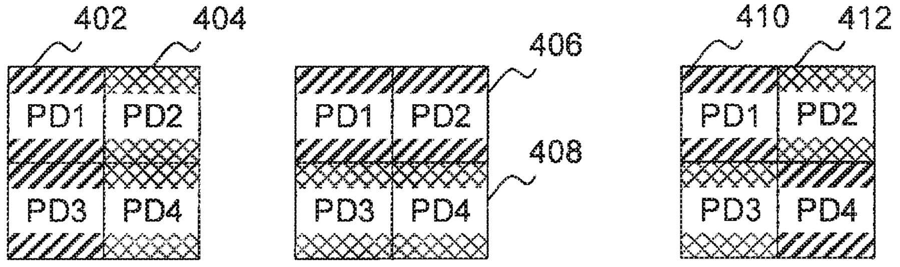
FIG. 4A shows two vertical PDs. Each PD is formed by binning two pixels, according to an embodiment of the present invention.
FIG. 4B shows two horizontal PDs. Each PD is formed by binning two pixels, according to an embodiment of the present invention.
FIG. 4C shows diagonal and counter diagonal PDs. Each PD is formed by binning two pixels, according to an embodiment of the present invention.

To obtain two horizontally separated vertical PDs 402 and 404 under a microlens, e.g., microlens 314, PD1, e.g., PD1 306, and PD3, e.g., PD3 310, are binned, and PD2, e.g., PD2 308, and PD4, e.g., PD4 312, are binned, as shown in FIG. 4A, according to an embodiment of the present invention. Vertical PD 402 may be vertical PD 208 and vertical PD 404 may be vertical PD 210 in 4-cell DPD pattern 212 in FIG. 2.

To obtain two vertically separated horizontal PDs 406 and 408 under a microlens, e.g., microlens 314, PD1, e.g., PD1 306, and PD2, e.g., PD2 308, are binned, and PD3, e.g., PD3 310, and PD4, e.g., PD4 312, are binned, as shown in FIG. 4B, according to an embodiment of the present invention. Horizontal PD 406 may be horizontal PD 218 and horizontal PD 408 may be horizontal PD 220 in 4-cell DPD pattern 214 in FIG. 2.

FIG. 4C shows PD1, e.g., PD1 306, is binned with PD4, e.g., PD4 312, to form a diagonally binned PD 410, according to an embodiment of the present invention. FIG. 4C also shows PD2, e.g., PD2 308, is binned with PD3, e.g., PD3 310, to form a counter-diagonally binned PD 412, according to an embodiment of the present invention.

Figure 5:
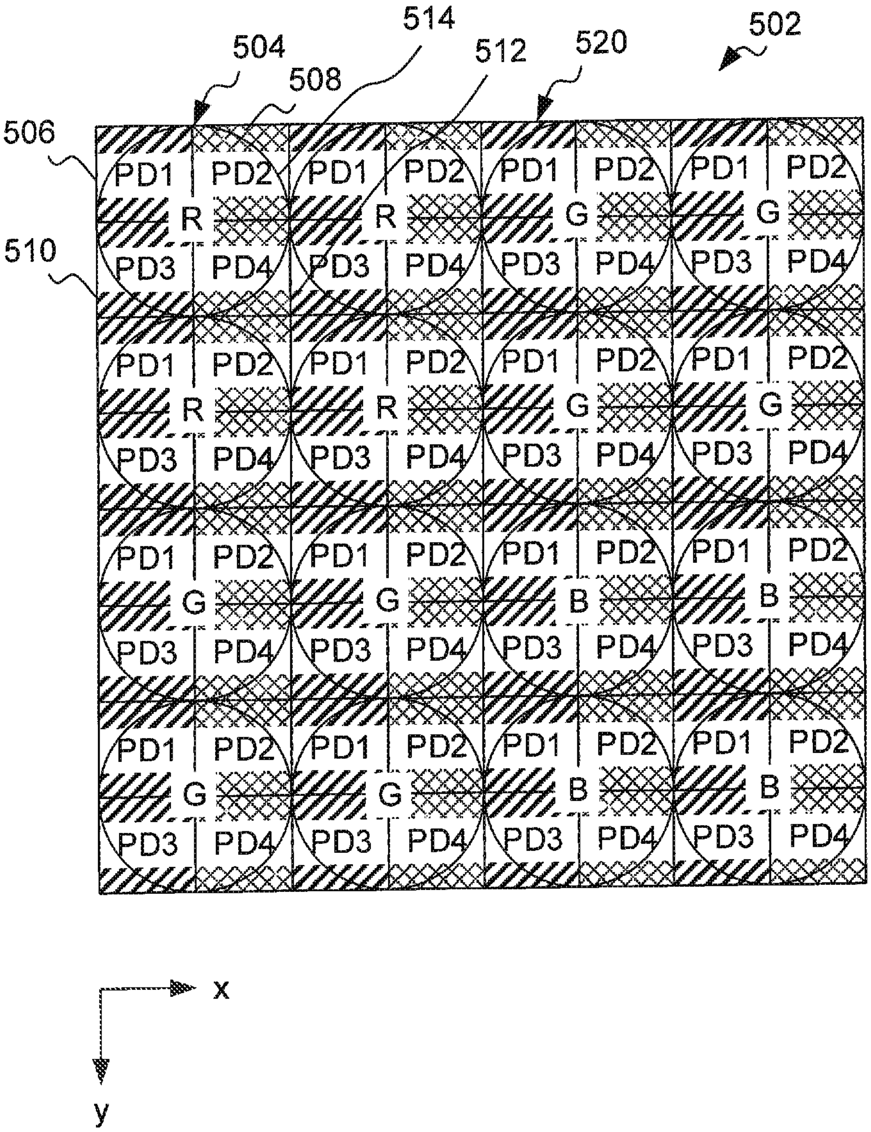
FIG. 5 shows an image sensor comprising 4×4 4-cell DPD pixel array, according to an embodiment of the present invention.

FIG. 5 shows an image sensor 502 comprising a 4×4 4-cell DPD pixel array 520, according to an embodiment of the present invention. Image sensor 502 comprises a pixel 504 including a PD1 506, a PD2 508, a PD3 510, and a PD4 512, under a microlens 514. Pixel 504 may be included in 4×4 4-cell pixel array 520. Although pixel 504 is illustrated as an R pixel, pixel 504 may be any of R pixel, G pixel, or B pixel. PD1 506 and PD3 510 are binned, and PD2 508 and PD4 512 are binned, forming two vertical PDs. Thus after binning, values at PD1 and PD3 are the same, and values at PD2 and PD4 are the same. However, values at PD1 and PD2 may be different, and values at PD3 and PD4 may be different.

Image sensor 502 will produce an image having higher sampling rate in x-direction or horizontal direction and lower sampling rate in y-direction or vertical direction. A final color image may be obtained from the image produced by image sensor 502 after appropriate remosaicing to a standard Bayer pattern, and a following standard RGB interpolation. Various remosaicing algorithms are available. Alternatively, a final color image may be obtained using a neural network algorithm with appropriate learning processes. Regardless what method is used to find the final color image, the resolution in x-direction or horizontal direction of the final color image will be better than the resolution in y-direction or vertical direction.

Figure 6:
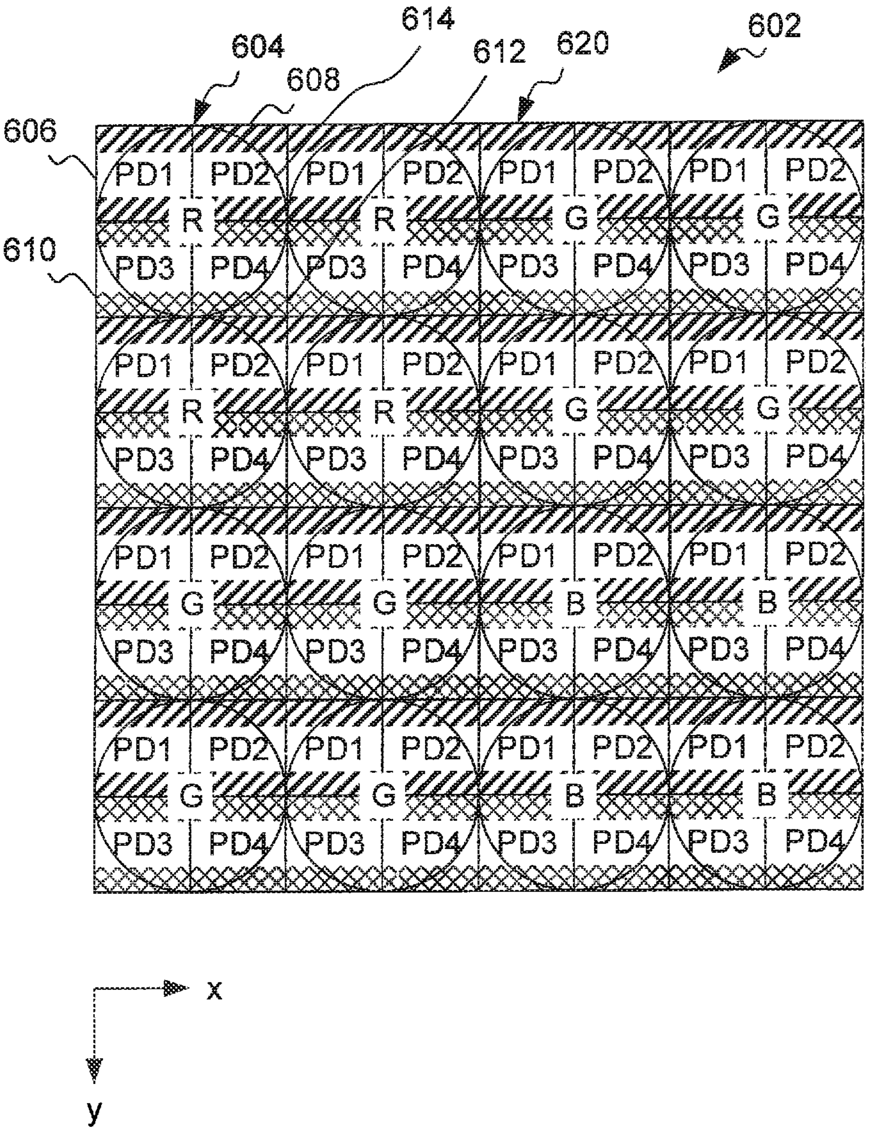
FIG. 6 shows an image sensor comprising 4×4 4-cell DPD pixel array, according to an embodiment of the present invention.

FIG. 6 shows an image sensor 602 comprising a 4×4 4-cell DPD pixel array 620, according to an embodiment of the present invention. Image sensor 602 comprises a pixel 604 including a PD1 606, a PD2 608, a PD3 610, and a PD4 612, under a microlens 614. Pixel 604 may be included in 4×4 4-cell pixel array 620. Although pixel 604 is illustrated as an R pixel, pixel 604 may be any of R pixel, G pixel, or B pixel. PD1 606 and PD2 608 are binned, and PD3 610 and PD4 612 are binned, forming two horizontal PDs. Thus after binning, values at PD1 and PD2 are the same, and values at PD3 and PD4 are the same. However, values at PD1 and PD3 may be different, and values at PD2 and PD4 may be different.

Image sensor 602 will produce an image having higher sampling rate in y-direction or vertical direction and lower sampling rate in x-direction or horizontal direction. A final color image may be obtained from the image produced by image sensor 602 after appropriate remosaicing to a standard Bayer pattern, and a following standard RGB interpolation. Various remosaicing algorithms are available. Alternatively, a final color image may be obtained using a neural network algorithm with appropriate learning processes. Regardless what method is used to find the final color image, the resolution in y-direction or vertical direction of the final color image will be better than the resolution in x-direction or horizontal direction.

Figure 7:
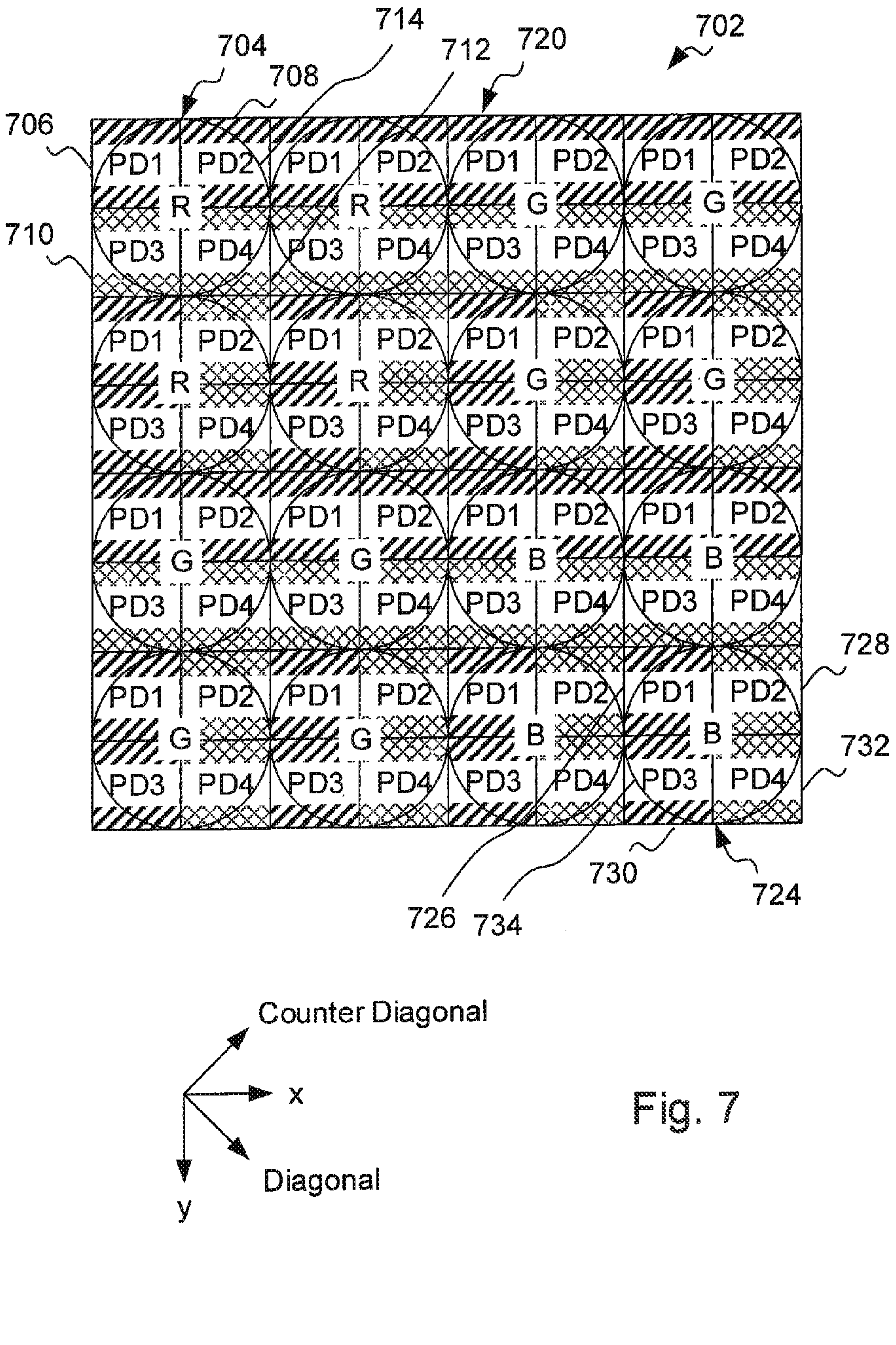
FIG. 7 shows an image sensor comprising 4×4 4-cell DPD pixel array, according to an embodiment of the present invention.

FIG. 7 shows an image sensor 702 comprising a 4×4 4-cell DPD pixel array 720, according to an embodiment of the present invention. Image sensor 702 comprises pairs of vertical PDs, e.g., vertical PDs 402 and 404 of FIG. 4A, and pairs of horizontal PDs, e.g., horizontal PDs 406 and 408 of FIG. 4B. The numbers of vertical PDs and horizontal PDs may be the same.

Image sensor 702 comprises a pixel 704 including a PD1 706, a PD2 708, a PD3 710, and a PD4 712, under a microlens 714. Pixel 704 may be included in 4×4 4-cell pixel array 720. Although pixel 704 is illustrated as an R pixel, pixel 704 may be any of R pixel, G pixel, or B pixel. PD1 706 and PD2 708 are binned, and PD3 710 and PD4 712 are binned, forming two horizontal PDs. Thus after binning, values at PD1 and PD2 are the same, and values at PD3 and PD4 are the same. However, values at PD1 and PD3 may be different, and values at PD2 and PD4 may be different.

Image sensor 702 also comprises a pixel 724 including a PD1 726, a PD2 728, a PD3 730, and a PD4 732, under a microlens 734. Pixel 724 may be included in 4×4 4-cell pixel array 720. Although pixel 724 is illustrated as a B pixel, pixel 724 may be any of R pixel, G pixel, or B pixel. PD1 726 and PD3 730 are binned, and PD2 728 and PD4 732 are binned, forming two vertical PDs. Thus after binning, values at PD1 and PD3 are the same, and values at PD2 and PD4 are the same. However, values at PD1 and PD2 may be different, and values at PD3 and PD4 may be different.

Image sensor 702 will produce an image comprising pixels having higher sampling rate in x-direction or horizontal direction and lower sampling rate in y-direction or vertical direction, and pixels having higher sampling rate in y-direction or vertical direction and lower sampling rate in x-direction or horizontal direction. A final color image may be obtained from the image produced by image sensor 702 that may have balanced resolution in x-direction or horizontal direction and in y-direction or vertical direction.

Since pairs of vertical and horizontal PDs are formed by 2×2 PDs in a pixel, e.g., pixel 304, pixel 504, pixel 604, pixel 704, and pixel 724, but no diagonal and counter diagonal pairs of PDs are formed, the final color image may have imbalanced resolution including x-direction, y-direction, diagonal direction and counter diagonal direction.

Figure 8:
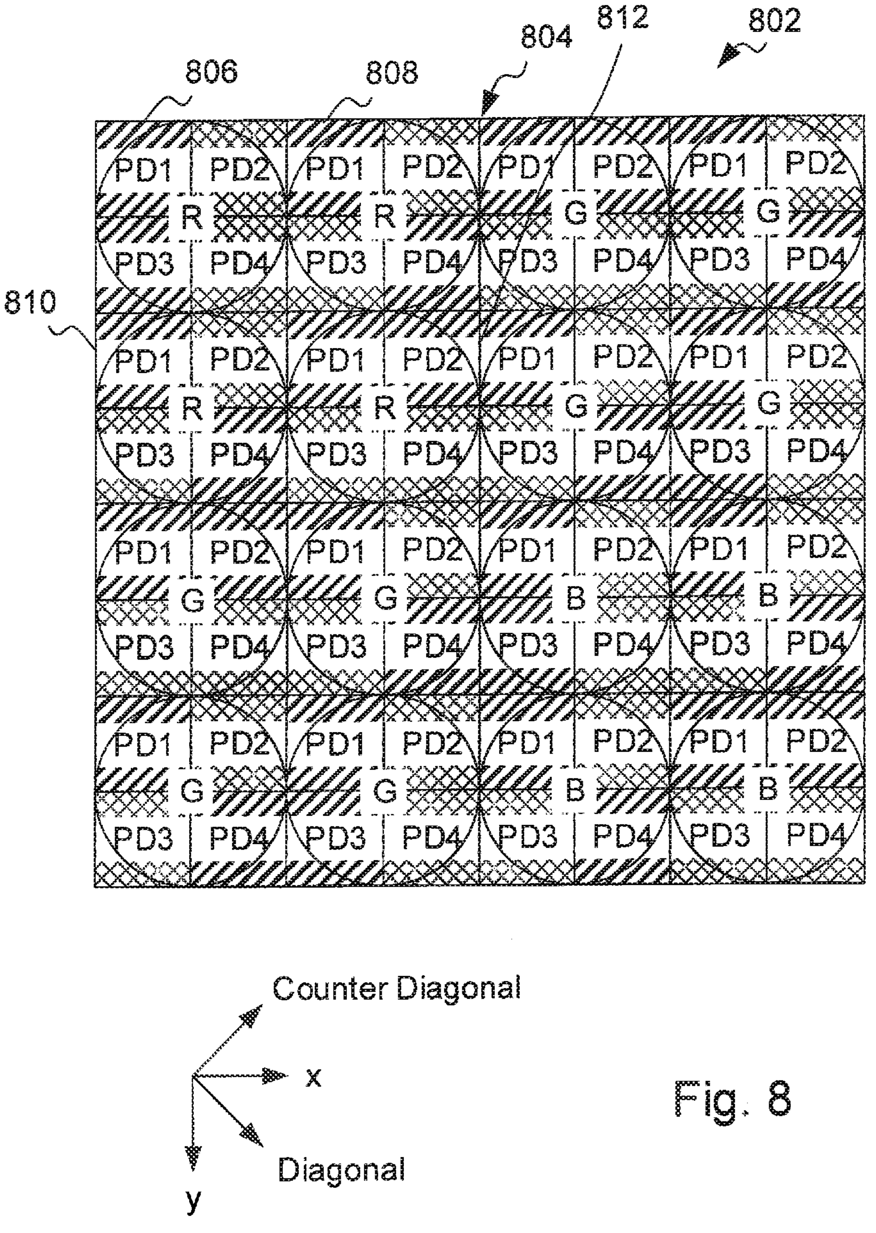
FIG. 8 shows an image sensor comprising 4×4 4-cell DPD pixel array, according to an embodiment of the present invention.

FIG. 8 shows an image sensor 802 comprising a 4×4 4-cell DPD pixel array 804, according to an embodiment of the present invention. 4×4 4-cell DPD pixel array 804 comprises a group of four R pixels, a group of four B pixels, and two groups of four G pixels. The four groups are located at the four corners of 4×4 4-cell DPD pixel array 804. A first group of pixels is a group of red pixels, a second group is a group of green pixels, a third group of pixels is a group of green pixels, and a fourth group of pixels is a group of blue pixels.

The four pixels are located at four corner of each group of pixels. Each pixel is covered by a microlens and a color filter. For example, R pixel is covered by an R color filter, G pixel is covered by a G color filter, and B pixel is covered by a B color filter. The color filter may be disposed between microlens and pixel.

Four pixels of the group of four R pixels may be pixel 806, pixel 808, pixel 810, and pixel 812, located at four corners of the group. Each pixel has four PDs, e.g., PD1, PD2, PD3, and PD4 located at four corners of the pixel. For example, PD1 may be located at upper-left corner of pixel 806, PD2 is located at upper-right corner of pixel 806, PD3 is located at lower-left corner of pixel 806, and PD4 is located at lower-right corner of pixel 806. PD1, PD2, PD3, and PD4 of pixels 808, 810, and 812 are located in a same way.

In pixel 806, PD1 is binned with PD3, PD2 is binned with PD4 forming a pair of vertical PDs. In pixel 808, PD1 is binned with PD4, PD2 is binned with PD3 forming a pair of counter diagonal and diagonal PDs. In pixel 810, similar to pixel 808, PD1 is binned with PD4, PD2 is binned with PD3 forming a pair of counter diagonal and diagonal PDs. In pixel 812, PD1 is binned with PD2, PD3 is binned with PD4 forming a pair of horizontal PDs.

The pattern of four B pixels may be similar to the pattern of four R pixels. Furthermore, the pattern of each group of four G pixels may also be similar to the pattern of four R pixels.

In this way, a final color image may be obtained from the image produced by image sensor 802 that may have balanced resolution in all x-direction or horizontal direction, y-direction or vertical direction, diagonal direction and counter diagonal direction.

Figure 9:
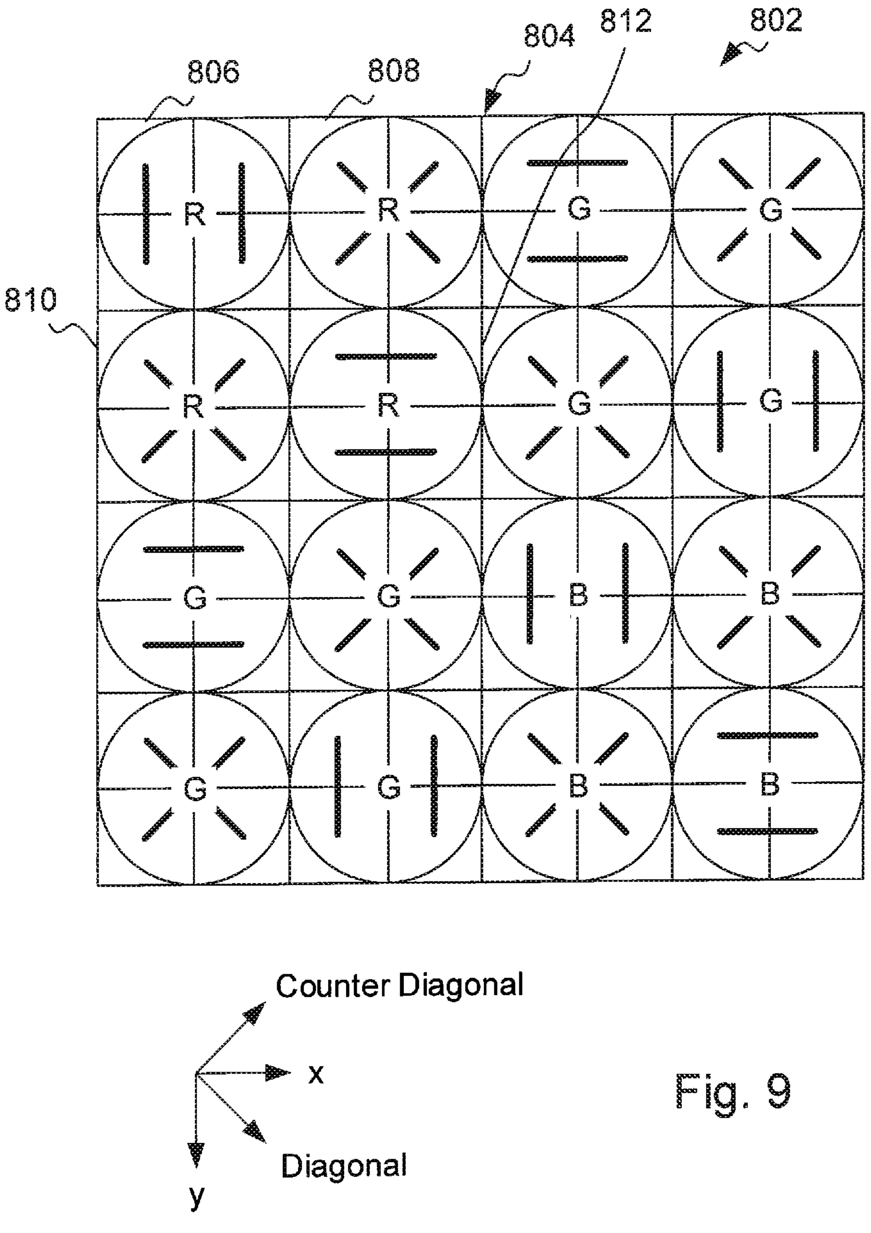
FIG. 9 shows an image sensor comprising 4×4 4-cell DPD pixel array, according to an embodiment of the present invention.

For reading convenience, similar to FIG. 8, FIG. 9 shows an image sensor 802 comprising a 4×4 4-cell DPD pixel array 804, according to an embodiment of the present invention. A pair of vertical PDs in pixel 806 are represented by two vertical bars. A pair of horizontal PDs in pixel 812 are represented by two horizontal bars. Pairs of diagonal and counter diagonal PDs in pixel 810 and pixel 808 are represented by two cross bars.

It is appreciated that any pair of PDs may be formed or may not be formed in any pixels 806, 808, 810, and 812. It is also appreciated that FIG. 8 may also show an image sensor 802 comprising a plurality of groups of pixels. Each group of pixels comprises a first pixel, e.g., pixel 806, a second pixel, e.g., pixel 808, a third pixel, e.g., pixel 810, and a fourth pixel, e.g., pixel 812.

Figure 10A:
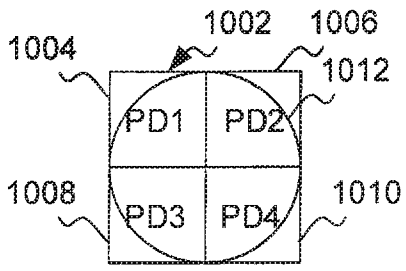
FIG. 10A shows a pixel having PD1, PD2, PD3, and PD4, under a microlens, according to an embodiment of the present invention.

FIG. 10A shows a pixel 1002 having PD1 1004, PD2 1006, PD3 1008, and PD4 1010, under a microlens 1012, according to an embodiment of the present invention. Pixel 1002 may be pixel 304, 504, 604, 704, or 724. Pixel 1002 may also be any pixel, e.g., 806, 808, 810, 812, etc. in FIG. 8 and FIG. 9.

Figure 10B:
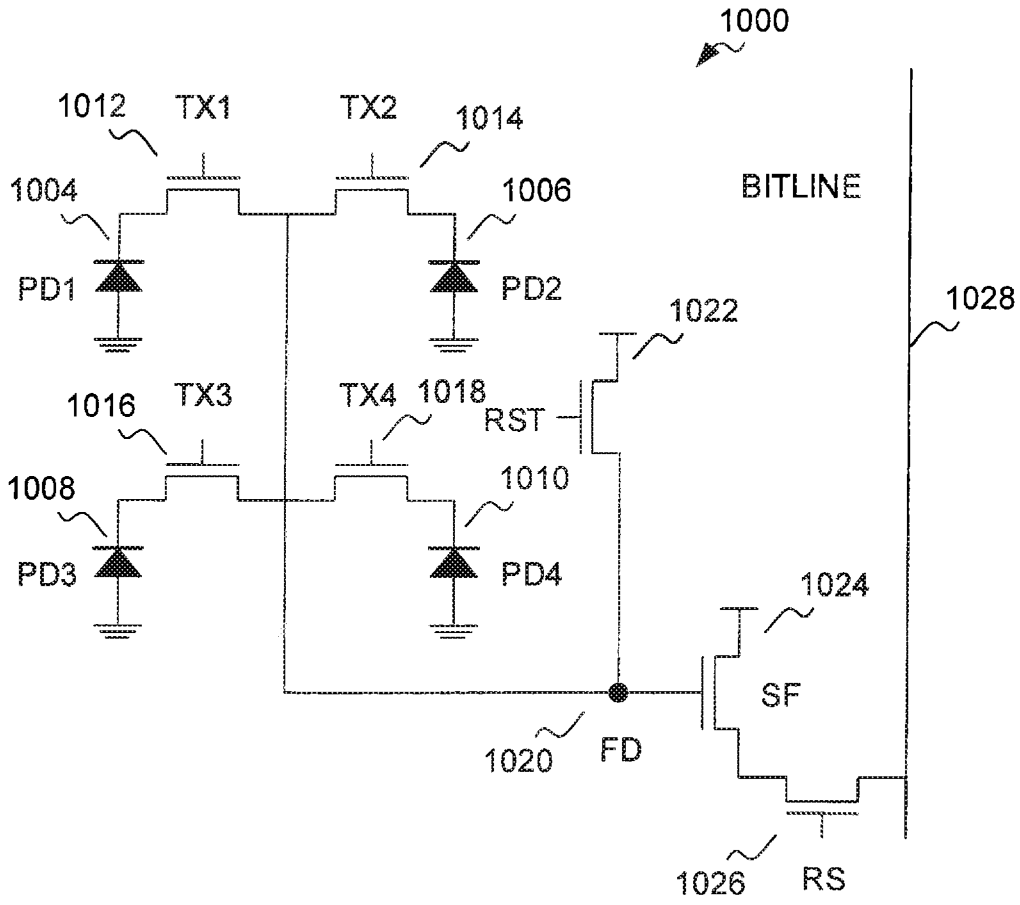
FIG. 10B shows a pixel reading circuit, according to an embodiment of the present invention.

FIG. 10B shows a pixel reading circuit 1000, according to an embodiment of the present invention. Any pixel, e.g., 806, 808, 810, 812, etc. in FIG. 8 and FIG. 9, may have its own pixel reading circuit 1000. Pixel reading circuit 1000 includes PD1 1004 coupled to a transfer transistor 1012, PD2 1006 coupled to a transfer transistor 1014, PD3 1008 coupled to a transfer transistor 1016, and PD4 1010 coupled to a transfer transistor 1018. A floating diffusion 1020 is coupled to transfer transistor 1012, transfer transistor 1014, transfer transistor 1016, and transfer transistor 1018.

Transfer transistor 1012 is controlled in response to a transfer control signal TX1, transfer transistor 1014 is controlled in response to a transfer control signal TX2, transfer transistor 1016 is controlled in response to a transfer control signal TX3, and transfer transistor 1018 is controlled in response to a transfer control signal TX4.

As such, charge photogenerated in PD1 1004 in response to incident light is transferred to floating diffusion 1020 in response to transfer control signal TX1, charge photogenerated in PD2 1006 in response to incident light is transferred to floating diffusion 1020 in response to transfer control signal TX2, charge photogenerated in PD3 1008 in response to incident light is transferred to floating diffusion 1020 in response to transfer control signal TX3, and charge photogenerated in PD4 1010 in response to incident light is transferred to floating diffusion 1020 in response to transfer control signal TX4.

An Reset transistor 1022 is coupled between a voltage supply (e.g., AVDD) and floating diffusion 1020. A gate of a source follower translator 1024 is coupled to the floating diffusion 1020. The drain of source follower transistor 1024 is coupled to a voltage supply (e.g., AVDD). An Row select transistor 1026 is coupled to a source of source follower transistor 1024. In operation, row select transistor 1026 is coupled to output a data signal (e.g., image data) from source follower transistor 1024 of pixel reading circuit 1000 to a bit line 1028 in response to an Row select signal RS.

PD1, PD2, PD3, and PD4 may be read individually. For example, at a time, transfer transistor 1012 receives an "ON" transfer control signal TX1, all transfer control signals TX2, TX3, and TX4 are "OFF", thus only photogenerated charges from PD1 are transferred to floating diffusion 1020, and will be read through bitline 1028, when select signal RS is "ON". In this way, PD1, PD2, PD3, PD4 can be read individually.

All or part of PD1, PD2, PD3, and PD4 may be binned. For example, to read the binned signal from PD1 and PD2, at a time, transfer transistor 1012 receives an "ON" transfer control signal TX1, transfer transistor 1014 also receives an "ON" transfer control signal TX2, transfer control signals TX3 and TX4 are "OFF", thus only photogenerated charges from PD1 and PD2 are transferred to floating diffusion 1020. They will be summed and read through bitline 1028, when select signal RS is "ON".

To read the binned signals from PD1 and PD3, at a time, transfer transistor 1012 receives an "ON" transfer control signal TX1, transfer transistor 1016 also receives an "ON" transfer control signal TX3, transfer control signals TX2 and TX4 are "OFF", thus only photogenerated charges from PD1 and PD3 are transferred to floating diffusion 1020. They will be summed and read through bitline 1028, when select signal RS is "ON".

To read the binned signals from PD1 and PD4, at a time, transfer transistor 1012 receives an "ON" transfer control signal TX1, transfer transistor 1018 also receives an "ON" transfer control signal TX4, transfer control signals TX2 and TX3 are "OFF", thus only photogenerated charges from PD1 and PD4 are transferred to floating diffusion 1020. They will be summed and read through bitline 1028, when select signal RS is "ON".

The binning among PD1, PD2, PD3, and PD4 is controlled by the timing of transfer control signals TX1, TX2, TX3, and TX4. Thus, the binning among PD1, PD2, PD3, and PD4 is reconfigurable. In an embodiment, two PDs are always binned, a frame can be read in two circles including a first binning of two PDs and a second binning of other two PDs. Any combination of binning is possible to configure.

To configure two vertical PDs 402 and 404 as shown in FIG. 4A, RST is "ON" to reset the photogenerated charges which have been transferred to floating diffusion at time T1. PD1 is binned with PD3 and read at time T2. TX1 and TX3 are "ON" and TX2 and TX3 are "OFF" and RS is "ON" at time T2. RST is "ON" to reset the photogenerated charges which have been transferred to floating diffusion at time T3. Then PD2 is binned with PD4 and read at time T4. TX2 and TX4 are "ON" and TX1 and TX3 are "OFF" and RS is "ON" at time T4.

To configure two horizontal PDs 406 and 408 as shown in FIG. 4B, RST is "ON" to reset the photogenerated charges which have been transferred to floating diffusion at time T1. PD1 is binned with PD2 and read at time T2. TX1 and TX2 are "ON" and TX3 and TX4 are "OFF" and RS is "ON" at time T2. RST is "ON" to reset the photogenerated charges which have been transferred to floating diffusion at time T3. Then PD3 is binned with PD4 and read at time T4. TX3 and TX4 are "ON" and TX1 and TX2 are "OFF" and RS is "ON" at time T4.

To configure diagonal PDs 410 as shown in FIG. 4C, RST is "ON" to reset the photogenerated charges which have been transferred to floating diffusion at time T1. PD1 is binned with PD4 and read at time T2. TX1 and TX4 are "ON" and TX2 and TX3 are "OFF" and RS is "ON" at time T2. To configure counter diagonal PD 412 as shown in FIG. 4C, RST is "ON" to reset the photogenerated charges which have been transferred to floating diffusion at time T3. PD2 is binned with PD3 and read at time T4. TX2 and TX3 are "ON" and TX1 and TX4 are "OFF" and RS is "ON" at time T4.

It is appreciated that any pixel, e.g., 806, 808, 810, 812, etc. in FIG. 8 and FIG. 9, may have its own pixel reading circuit 1000. Pixels 806, 808, 810, 812 may be read at same time, or at different time.

While the present invention has been described herein with respect to the exemplary embodiments and the best mode for practicing the invention, it will be apparent to one of ordinary skill in the art that many modifications, improvements and sub-combinations of the various embodiments, adaptations, and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor comprising a 4-cell dual photodiode (DPD) pixel array having a first group of pixels, a second group of pixels, a third group of pixels, and a fourth group of pixels, the four groups of pixels located at four corners of the 4-cell DPD pixel array;

the first group of pixels comprising a first pixel, a second pixel, a third pixel, and a fourth pixel, the four pixels located at four corners of the first group of pixels;

the first pixel comprising a first photodiode, a second photodiode, a third photodiode, and a fourth photodiode, the four photodiodes located at four corners of the first pixel;

the first photodiode located at upper-left corner of the first pixel, the second photodiode located at upper-right corner of the first pixel, the third photodiode located at lower-left corner of the first pixel, and the fourth photodiode located at lower-right corner of the first pixel;

wherein the first photodiode, the second photodiode, the third photodiode, and the fourth photodiode are covered by a microlens; and wherein the first photodiode is binned with the fourth photodiode, and the second photodiode is binned with the third photodiode.

2. The image sensor of claim 1, wherein the second pixel comprises a fifth photodiode, a sixth photodiode, a seventh photodiode, and an eighth photodiode, the four photodiodes located at four corners of the second pixel;

the fifth photodiode located at upper-left of the second pixel, the sixth photodiode located at upper-right of the second pixel, the seventh photodiode located at lower-left of the second pixel, and the eighth photodiode located at lower-right of the second pixel;

wherein the fifth photodiode, the sixth photodiode, the seventh photodiode, and the eighth photodiode are covered by a microlens; and wherein the fifth photodiode is binned with the seventh photodiode, and the sixth photodiode is binned with the eighth photodiode.

3. The image sensor of claim 1, wherein the third pixel comprises a ninth photodiode, a tenth photodiode, an eleventh photodiode, and a twelfth photodiode, the four photodiodes located at four corners of the third pixel;

the ninth photodiode located at upper-left of the third pixel, the tenth photodiode located at upper-right of the third pixel, the eleventh photodiode located at lower-left of the third pixel, and the twelfth photodiode located at lower-right of the third pixel;

wherein the ninth photodiode, the tenth photodiode, the eleventh photodiode, and the twelfth photodiode are covered by a microlens; and wherein the ninth photodiode is binned with the tenth photodiode, and the eleventh photodiode is binned with the twelfth photodiode.

4. The image sensor of claim 1 further comprising a circuit for reading signals of photodiodes of the first pixel, the circuit comprising:

a first transfer transistor coupled to the first photodiode, wherein the first transfer transistor is controlled by a first transfer control signal;

a second transfer transistor coupled to the second photodiode, wherein the second transfer transistor is controlled by a second transfer control signal;

a third transfer transistor coupled to the third photodiode, wherein the third transfer transistor is controlled by a third transfer control signal;

a fourth transfer transistor coupled to the fourth photodiode, wherein the fourth transfer transistor is controlled by a fourth transfer control signal;

a floating diffusion coupled to the first transfer transistor, the second transfer transistor, the third transfer transistor, and the fourth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a first time the first and fourth transfer control signals are “ON” and the second and third transfer control signals are “OFF”, and the row select signal is “ON”, and at a second time the second and third transfer control signals are “ON” and the first and fourth transfer control signals are “OFF”, and the row select signal is “ON”.

5. The image sensor of claim 2 further comprising a circuit for reading signals of photodiodes of the second pixel, the circuit comprising:

a fifth transfer transistor coupled to the fifth photodiode, wherein the fifth transfer transistor is controlled by a fifth transfer control signal;

a sixth transfer transistor coupled to the sixth photodiode, wherein the sixth transfer transistor is controlled by a sixth transfer control signal;

a seventh transfer transistor coupled to the seventh photodiode, wherein the seventh transfer transistor is controlled by a seventh transfer control signal;

an eighth transfer transistor coupled to the eighth photodiode, wherein the eighth transfer transistor is controlled by an eighth transfer control signal;

a floating diffusion coupled to the fifth transfer transistor, the sixth transfer transistor, the seventh transfer transistor, and the eighth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a first time the fifth and seventh transfer control signals are “ON” and the sixth and eighth transfer control signals are “OFF”, and the row select signal is “ON”, and at a second time the sixth and eighth transfer control signals are “ON” and the fifth and seventh transfer control signals are “OFF”, and the row select signal is “ON”.

6. The image sensor of claim 3 further comprising a circuit for reading signals of photodiodes of the third pixel, the circuit comprising:

a ninth transfer transistor coupled to the ninth photodiode, wherein the ninth transfer transistor is controlled by a ninth transfer control signal;

a tenth transfer transistor coupled to the tenth photodiode, wherein the tenth transfer transistor is controlled by a tenth transfer control signal;

an eleventh transfer transistor coupled to the eleventh photodiode, wherein the eleventh transfer transistor is controlled by an eleventh transfer control signal;

a twelfth transfer transistor coupled to the twelfth photodiode, wherein the twelfth transfer transistor is controlled by a twelfth transfer control signal;

a floating diffusion coupled to the ninth transfer transistor, the tenth transfer transistor, the eleventh transfer transistor, and the twelfth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a first time the ninth and tenth transfer control signals are "ON" and the eleventh and twelfth transfer control signals are "OFF", and the row select signal is "ON", and at a second time the eleventh and twelfth transfer control signals are "ON" and the ninth and tenth transfer control signals are "OFF", and the row select signal is "ON".

7. The image sensor of claim 1, wherein the first group of pixels is one of a group of red pixels, a group of green pixels, and a group of blue pixels.

8. The image sensor of claim 1, wherein the first group of pixels is a group of red pixels, the second group is a group of green pixels, the third group of pixels is a group of green pixels, and the fourth group of pixels is a group of blue pixels.

9. An image sensor comprising a 4-cell dual photodiode (DPD) pixel array having a first group of pixels, a second group of pixels, a third group of pixels, and a fourth group of pixels, the four groups of pixels located at four corners of the 4-cell DPD pixel array;

the first group of pixels comprising a first pixel, a second pixel, a third pixel, and a fourth pixel, the four pixels located at four corner of the first group of pixels;

the first pixel comprising a first photodiode, a second photodiode, a third photodiode, and a fourth photodiode, the four photodiodes located at four corners of the first pixel;

the first photodiode located at upper-left corner of the first pixel, the second photodiode located at upper-right corner of the first pixel, the third photodiode located at lower-left corner of the first pixel, and the fourth photodiode located at lower-right corner of the first pixel;

wherein the first photodiode, the second photodiode, the third photodiode, and the fourth photodiode are covered by a microlens; and wherein the first photodiode is binned with the third photodiode, and the second photodiode is binned with the fourth photodiode; and the second pixel comprising a fifth photodiode, a sixth photodiode, a seventh photodiode, and an eighth photodiode, the four photodiodes located at four corners of the second pixel, the fifth photodiode located at upper-left of the second pixel, the sixth photodiode located at upper-right of the second pixel, the seventh photodiode located at lower-left of the second pixel, and the eighth photodiode located at lower-right of the second pixel;

wherein the fifth photodiode, the sixth photodiode, the seventh photodiode, and the eighth photodiode are covered by a microlens; and wherein the fifth photodiode is binned with the sixth photodiode, and the seventh photodiode is binned with the eighth photodiode.

10. The image sensor of claim 9 further comprising a first circuit for reading signals of photodiodes of the first pixel, the circuit comprising:

a first transfer transistor coupled to the first photodiode, wherein the first transfer transistor is controlled by a first transfer control signal;

a second transfer transistor coupled to the second photodiode, wherein the second transfer transistor is controlled by a second transfer control signal;

a third transfer transistor coupled to the third photodiode, wherein the third transfer transistor is controlled by a third transfer control signal;

a fourth transfer transistor coupled to the fourth photodiode, wherein the fourth transfer transistor is controlled by a fourth transfer control signal;

a floating diffusion coupled to the first transfer transistor, the second transfer transistor, the third transfer transistor, and the fourth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a first time the first and third transfer control signals are "ON" and the second and fourth transfer control signals are "OFF", and the row select signal is "ON", and at a second time the second and fourth transfer control signals are "ON" and the first and third transfer control signals are "OFF", and the row select signal is "ON".

11. The image sensor of claim 10 further comprising a second circuit for reading signals of photodiodes of the second pixel, the circuit comprising:

a fifth transfer transistor coupled to the fifth photodiode, wherein the fifth transfer transistor is controlled by a fifth transfer control signal;

a sixth transfer transistor coupled to the sixth photodiode, wherein the sixth transfer transistor is controlled by a sixth transfer control signal;

a seventh transfer transistor coupled to the seventh photodiode, wherein the seventh transfer transistor is controlled by a seventh transfer control signal;

an eighth transfer transistor coupled to the eighth photodiode, wherein the eighth transfer transistor is controlled by an eighth transfer control signal;

a floating diffusion coupled to the fifth transfer transistor, the sixth transfer transistor, the seventh transfer transistor, and the eighth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a third time the fifth and sixth transfer control signals are "ON" and the seventh and eighth transfer control signals are "OFF", and the row select signal is "ON", and at a fourth time the seventh and eighth transfer control signals are "ON" and the fifth and sixth transfer control signals are "OFF", and the row select signal is "ON".

12. The image sensor of claim 11, wherein the third time is same time as the first time, and the fourth time is same time as the second time.

13. The image sensor of claim 9, wherein the first group of pixels is one of a group of red pixels, a group of green pixels, and a group of blue pixels.

14. The image sensor of claim 9, wherein the first group of pixels is a group of red pixels, the second group is a group of green pixels, the third group of pixels is a group of green pixels, and the fourth group of pixels is a group of blue pixels.

15. An image sensor comprising a plurality of groups of pixels, wherein a group of pixels comprises:

a first pixel, a second pixel, a third pixel, and a fourth pixel, the four pixels located at four corner of the group of pixels;

the first pixel comprising a first photodiode, a second photodiode, a third photodiode, and a fourth photodiode, the four photodiodes covered by a microlens;

the first photodiode located at upper-left corner of the first pixel, the second photodiode located at upper-right corner of the first pixel, the third photodiode located at lower-left corner of the first pixel, and the fourth photodiode located at lower-right corner of the first pixel, wherein the first photodiode is binned with the third photodiode, and the second photodiode is binned with the fourth photodiode;

the second pixel comprising a fifth photodiode, a sixth photodiode, a seventh photodiode, and an eighth photodiode, the four photodiodes covered by a microlens;

the fifth photodiode located at upper-left of the second pixel, the sixth photodiode located at upper-right of the second pixel, the seventh photodiode located at lower-left of the second pixel, and the eighth photodiode located at lower-right of the second pixel, and wherein the fifth photodiode is binned with the eighth photodiode, and the sixth photodiode is binned with the seventh photodiode;

the third pixel comprising a ninth photodiode, a tenth photodiode, an eleventh photodiode, and a twelfth photodiode, the four photodiodes covered by a microlens;

the ninth photodiode located at upper-left of the third pixel, the tenth photodiode located at upper-right of the third pixel, the eleventh photodiode located at lower-left of the third pixel, and the twelfth photodiode located at lower-right of the third pixel, and the ninth photodiode is binned with the twelfth photodiode, and the tenth photodiode is binned with the eleventh photodiode;

the fourth pixel comprising a thirteenth photodiode, a fourteenth photodiode, a fifteenth photodiode, and a sixteenth photodiode, the four photodiodes covered by a microlens;

the thirteenth photodiode located at upper-left of the fourth pixel, the fourteenth photodiode located at upper-right of the fourth pixel, the fifteenth photodiode located at lower-left of the fourth pixel, and the sixteenth photodiode located at lower-right of the fourth pixel, and wherein the thirteenth photodiode is binned with the fourteenth photodiode, and the fifteenth photodiode is binned with the sixteenth photodiode.

16. The image sensor of claim 15 further comprising a first circuit for reading signals of photodiodes of the first pixel, the circuit comprising:

a first transfer transistor coupled to the first photodiode, wherein the first transfer transistor is controlled by a first transfer control signal;

a second transfer transistor coupled to the second photodiode, wherein the second transfer transistor is controlled by a second transfer control signal;

a third transfer transistor coupled to the third photodiode, wherein the third transfer transistor is controlled by a third transfer control signal;

a fourth transfer transistor coupled to the fourth photodiode, wherein the fourth transfer transistor is controlled by a fourth transfer control signal;

a floating diffusion coupled to the first transfer transistor, the second transfer transistor, the third transfer transistor, and the fourth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a first time the first and third transfer control signals are "ON" and the second and fourth transfer control signals are "OFF", and the row select signal is "ON", and at a second time the second and fourth transfer control signals are "ON" and the first and third transfer control signals are "OFF", and the row select signal is "ON".

17. The image sensor of claim 16 further comprising a second circuit for reading signals of photodiodes of the second pixel, the circuit comprising:

a fifth transfer transistor coupled to the fifth photodiode, wherein the fifth transfer transistor is controlled by a fifth transfer control signal;

a sixth transfer transistor coupled to the sixth photodiode, wherein the sixth transfer transistor is controlled by a sixth transfer control signal;

a seventh transfer transistor coupled to the seventh photodiode, wherein the seventh transfer transistor is controlled by a seventh transfer control signal;

an eighth transfer transistor coupled to the eighth photodiode, wherein the eighth transfer transistor is controlled by an eighth transfer control signal;

a floating diffusion coupled to the fifth transfer transistor, the sixth transfer transistor, the seventh transfer transistor, and the eighth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a third time the fifth and eighth transfer control signals are "ON" and the sixth and seventh transfer control signals are "OFF", and the row select signal is "ON", and at a fourth time the sixth and seventh transfer control signals are "ON" and the fifth and eighth transfer control signals are "OFF", and the row select signal is "ON".

18. The image sensor of claim 17 further comprising a third circuit for reading signals of photodiodes of the third pixel, the circuit comprising:

a ninth transfer transistor coupled to the ninth photodiode, wherein the ninth transfer transistor is controlled by a ninth transfer control signal;

a tenth transfer transistor coupled to the tenth photodiode, wherein the tenth transfer transistor is controlled by a tenth transfer control signal;

an eleventh transfer transistor coupled to the eleventh photodiode, wherein the eleventh transfer transistor is controlled by an eleventh transfer control signal;

a twelfth transfer transistor coupled to the twelfth photodiode, wherein the twelfth transfer transistor is controlled by a twelfth transfer control signal;

a floating diffusion coupled to the ninth transfer transistor, the tenth transfer transistor, the eleventh transfer transistor, and the twelfth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a fifth time the ninth and twelfth transfer control signals are "ON" and the tenth and eleventh transfer control signals are "OFF", and the row select signal is "ON", and at a sixth time the tenth and eleventh transfer control signals are "ON" and the ninth and twelfth transfer control signals are "OFF", and the row select signal is "ON".

19. The image sensor of claim 18 further comprising a fourth circuit for reading signals of photodiodes of the fourth pixel, the circuit comprising:

a thirteenth transfer transistor coupled to the thirteenth photodiode, wherein the thirteen transfer transistor is controlled by a thirteenth transfer control signal;

a fourteen transfer transistor coupled to the fourteenth photodiode, wherein the fourteenth transfer transistor is controlled by a fourteenth transfer control signal;

a fifteenth transfer transistor coupled to the fifteenth photodiode, wherein the fifteenth transfer transistor is controlled by a fifteenth transfer control signal;

a sixteenth transfer transistor coupled to the sixteenth photodiode, wherein the sixteenth transfer transistor is controlled by a sixteenth transfer control signal;

a floating diffusion coupled to the thirteenth transfer transistor, the fourteenth transfer transistor, the fifteenth transfer transistor, and the sixteenth transfer transistor;

a source follower transistor wherein a gate of the source follower translator is coupled to the floating diffusion; and an Row select transistor coupled to a source of the source follower transistor to output a data signal, wherein the row select transistor is controlled by an Row select signal;

wherein at a seventh time the thirteenth and fourteenth transfer control signals are "ON" and the fifteenth and sixteenth transfer control signals are "OFF", and the row select signal is "ON", and at an eighth time the fifteenth and sixteenth transfer control signals are "ON" and the thirteenth and fourteenth transfer control signals are "OFF", and the row select signal is "ON".

20. The image sensor of claim 19, wherein the third time, the fifth time, and the seventh time are same time as the first time, and the fourth time, the sixth time, and the eighth time are same time as the second time.

* * * * *